(12) United States Patent
Alexander

(10) Patent No.: US 11,698,395 B1
(45) Date of Patent: Jul. 11, 2023

(54) CURRENT TESTING DEVICE

(71) Applicant: John Alexander, Quinton, AL (US)

(72) Inventor: John Alexander, Quinton, AL (US)

( * ) Notice: Subject to any disclaimer, the term of this patent is extended or adjusted under 35 U.S.C. 154(b) by 21 days.

(21) Appl. No.: 17/535,619

(22) Filed: Nov. 25, 2021

(51) Int. Cl.
*G01R 15/12* (2006.01)
*G01R 19/165* (2006.01)

(52) U.S. Cl.
CPC ....... *G01R 19/16561* (2013.01); *G01R 15/12* (2013.01); *G01R 19/16542* (2013.01)

(58) Field of Classification Search
CPC .............. G01R 31/74; G01R 31/31708; G01R 31/3177; G01R 31/318307; G01R 31/318519; G01R 31/318583; G01R 31/327; G01R 19/16561; G01R 19/16566; G01R 15/12; G01R 15/125; G06F 30/20; H01H 73/04
See application file for complete search history.

(56) References Cited

U.S. PATENT DOCUMENTS

| | | | | |
|---|---|---|---|---|
| 3,023,518 A * | 3/1962 | Brown | ................... | G09B 9/165 434/366 |
| 5,852,796 A * | 12/1998 | Stepanenko, Jr. | ..... | G01R 31/74 702/89 |
| 6,429,663 B1 * | 8/2002 | LaCoste | ............. | G01R 31/3275 324/537 |
| 7,148,698 B2 * | 12/2006 | Becker | ................... | G01R 31/74 324/555 |
| 7,394,343 B2 * | 7/2008 | Cheng | ................ | H01H 85/0208 324/507 |
| 9,174,299 B2 * | 11/2015 | Graft | ................. | B29C 66/91655 |
| 10,216,864 B1 * | 2/2019 | Berg | ....................... | G06F 30/20 |
| 10,921,350 B2 | 2/2021 | Clark | | |
| 2009/0146609 A1 * | 6/2009 | Santos | .................. | H02J 7/0044 320/111 |

* cited by examiner

*Primary Examiner* — Vinh P Nguyen
(74) *Attorney, Agent, or Firm* — Sanchelima & Associates, P.A.; Christian Sanchelima; Jesus Sanchelima

(57) ABSTRACT

A current testing device including a housing assembly, an electrical assembly and a circuit board assembly is disclosed herein. The housing assembly includes a housing that encloses the electrical assembly. The electrical assembly includes a battery, a microprocessor, a display, a keypad, a power button, an electrical port, and test cables. The microprocessor permits the user to simulate a fuse. The microprocessor has a memory in which a predetermined catalogue of fuses characteristics is stored. The user connects the test cables to a circuit board where the fuse is blown. The keypad allows the user to type the simulation characteristics while the display shows the results of the simulation.

8 Claims, 3 Drawing Sheets

CURRENT TESTING DEVICE

BACKGROUND OF THE INVENTION

1. Field of the Invention

The present invention relates to a current testing device and, more particularly, to a current testing device that allows a user to program and simulate a fuse for an external electrical circuit.

2. Description of the Related Art

Several designs for current testing device have been designed in the past. None of them, however, include a fuse saving current test device that is comprised of a handheld test device that allows the user to program a simulated fuse that when attached to an electrical circuit will indicate the current level and open the circuit if the current level exceeds the programed fuse specifications.

Applicant believes that a related reference corresponds to U.S. Pat. No. 10,921,350 issued for a voltage testing system with a pair of probes and a protection fuse. Applicant believes that another related reference corresponds to U.S. Pat. No. 7,148,698 issued for a testing device for fused circuits that provides an alert if the current passes a set threshold. None of these references, however, teach of a current testing device that includes a handheld test device that allows the user to simulate a fuse based on programed fuse specifications.

Other documents describing the closest subject matter provide for a number of more or less complicated features that fail to solve the problem in an efficient and economical way. None of these patents suggest the novel features of the present invention.

SUMMARY OF THE INVENTION

It is one of the objects of the present invention to provide a current testing device that includes a handheld testing device that allows the user to program a simulated fuse.

It is another object of this invention to provide a current testing device that has a memory in which a variety of fuses models specifications are stored in order to permit the user to select one of them for simulation purposes.

It is still another object of the present invention to provide a current testing device that open the circuit if the current level exceeds the programed fuse specifications and indicates the current level reached.

It is yet another object of this invention to provide such a device that is inexpensive to implement and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Figure 1:
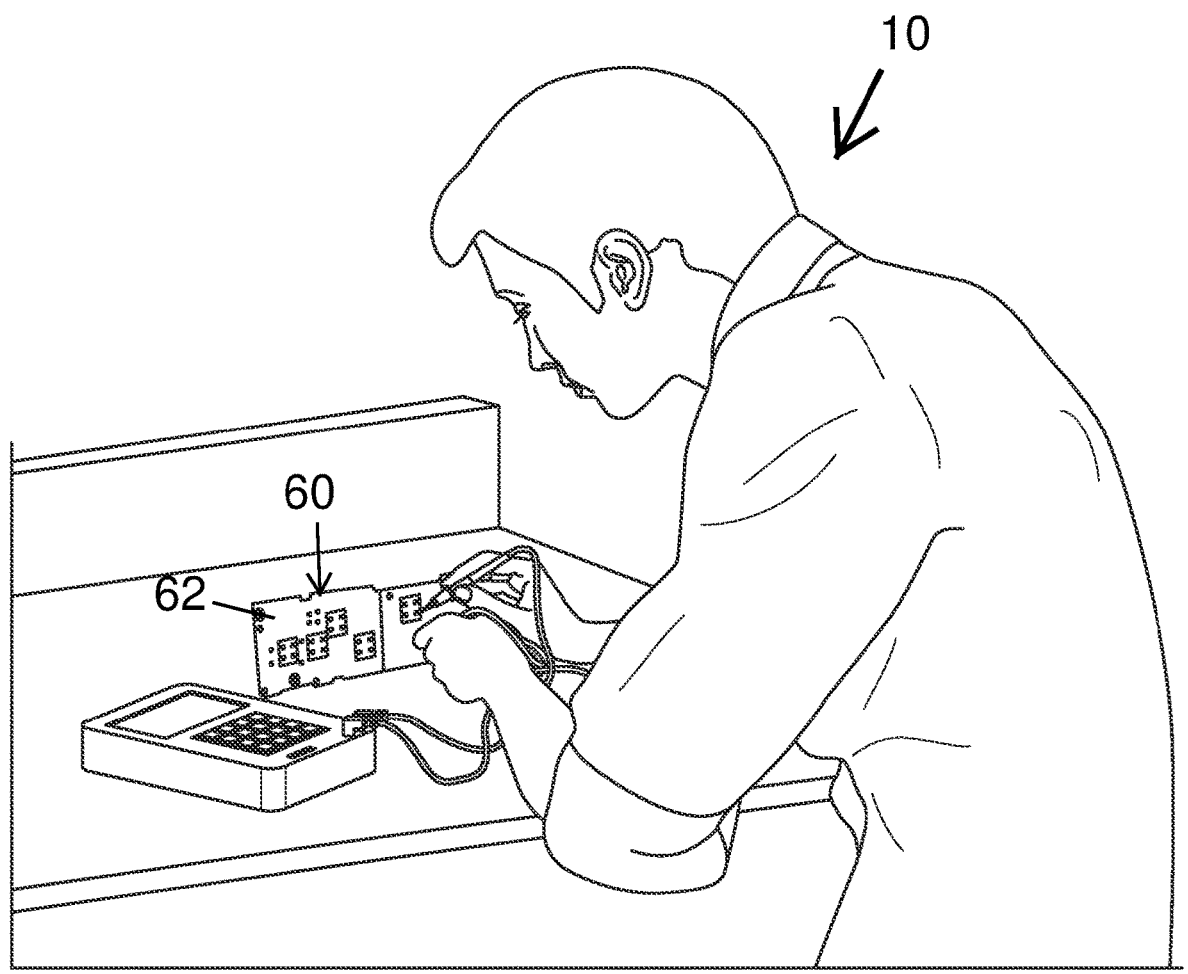
FIG. 1 represents an isometric operational view of the present invention 10 where a person is using the current testing device 10 to simulate a fuse. The present invention 10 is connected to an electric circuit board 62 where a fuse has blown.
Figure 2:
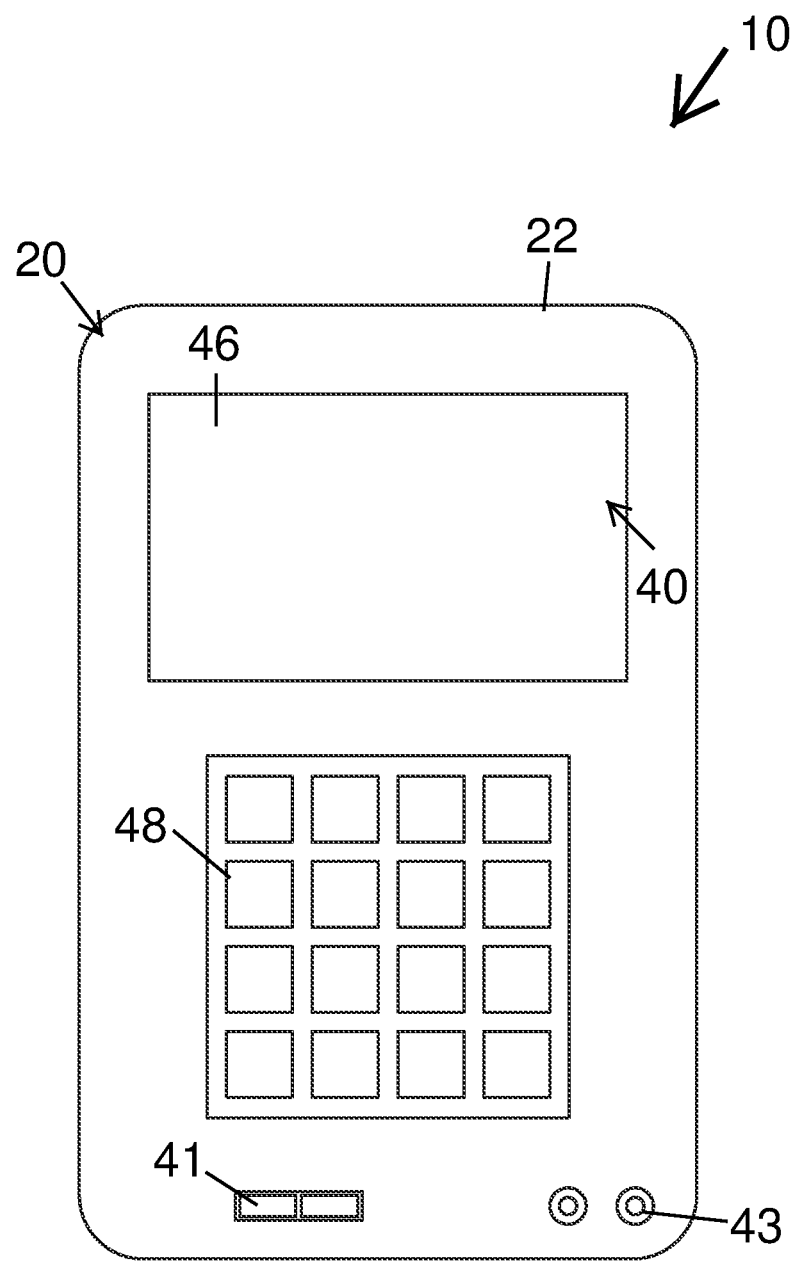
FIG. 2 shows a frontal view of the present invention 10 depicting the housing assembly 20 that includes a housing 22, it is also depicted the electrical assembly 40 that includes a display 46, a keypad 48, a power button 41 and an electric port 43.
Figure 3:
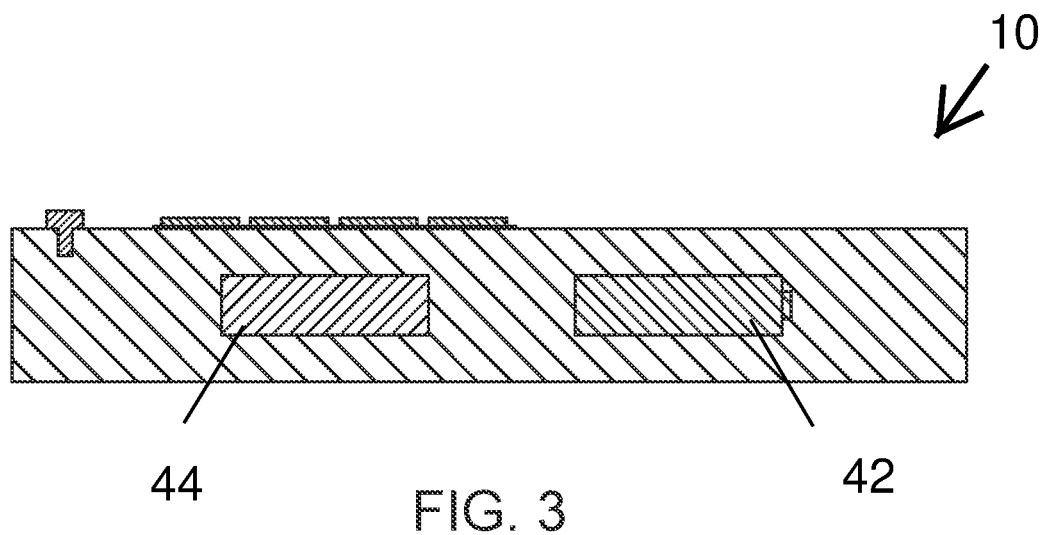
FIG. 3 illustrates a cross-sectional view of the present invention 10 showing a battery 42 and a microprocessor 44.
Figure 4:
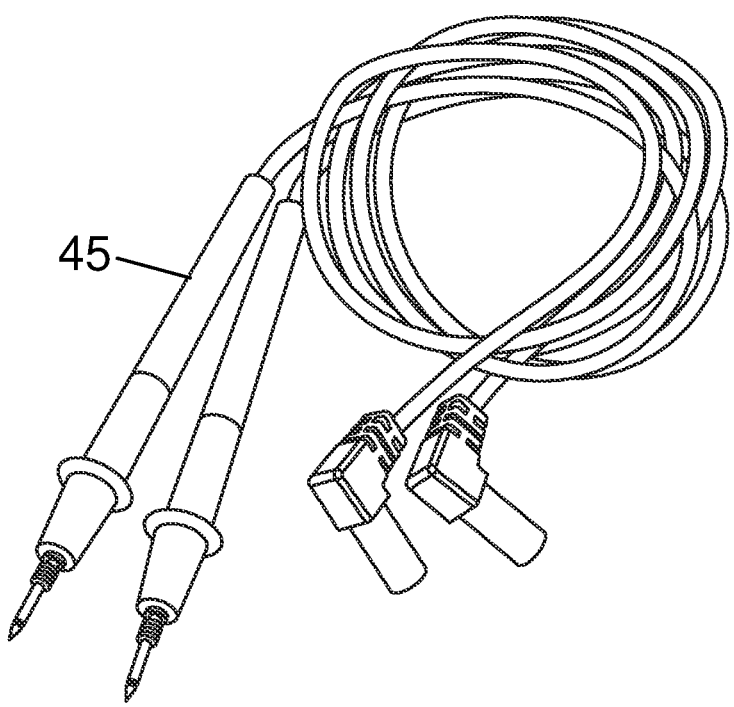
FIG. 4 illustrates an isometric view of the test leads 45 used for connecting the present invention with an external circuit board.

Referring now to the drawings, where the present invention is generally referred to with numeral 10, it can be observed that it basically includes a housing assembly 20, an electrical assembly 40 and a circuit board assembly 60. It should be understood there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

The housing assembly 20 includes a housing 22. A preferable embodiment for the housing 22 has a rectangular prism shape. Other embodiments for the housing 22 have an irregular prism shape, a regular prism shape such as triangular prism, rectangular prism, or any variation thereof. The housing 22 may be made of a resistant material, for electrical purposes a suitable material for the housing 22 may be plastic because plastic may offer characteristics like electrical insulation, heat insulation, lightweight, durability. The housing 22 may be made of a variety of plastics such as acrylonitrile butadiene styrene, polycarbonate, polyphenylene oxide, polystyrene, or any variation thereof. The housing 22 may enclosed the electrical assembly 40.

The electrical assembly 40 includes a battery 42, a microprocessor 44, a display 46, a keypad 48, a power button 41, an electrical port 43 and test cables 45. The battery 42 may be placed inside the housing assembly 20. The battery 42 may be non-rechargeable such as zinc-carbon battery, magnesium battery, mercury battery, lithium/solid cathode battery, lithium/solid electrolyte battery. Other embodiment may suggest the battery 42 to be rechargeable, a rechargeable battery may be a nickel cadmium battery. The battery 42 may supply electric energy to the microprocessor 44 and the display 46. The power button 41 may be connected to the battery. The power button 41 may be a pushbutton switch, a toggle switch, a selector switch, or any variation thereof. The power button 41 may turn on the present invention 10. The power button may be located in the front face of the housing 22. The power button 41 may be centered and placed proximal to the bottom face of the housing 22, however, the power button may be located wheresoever in the housing 22. The power button 41 may allow or impede the electric energy to flow through the microprocessor 44 and the display 46. The microprocessor 44 may be located inside the housing 22. The microprocessor 44 may be connected to the display 46, to the keypad 48 and to the electrical port 43. The microprocessor 44 may have a memory. The microprocessor 44 may be able to simulate a fuse. The simulation of the fuse may be performed with a suitable program such as a virtual fuse simulator. The microprocessor 44 may have a memory wherein may be stored a predetermined catalogue of fuse specifications, such as rated voltage, rated current, breaking capacity. The microprocessor 44 may permit a user to select the type of testing that may be performed, a suitable number of tests that may be performed are two, one in which the user may manually type the specifications of the fuse and other that may permit the user to select a fuse from the predetermined catalogue. To perform a desired test the user may have to program the microcontroller 44. The programming of the microprocessor 44 may be done using a programming language such as ladder diagram, instruction list, function block diagram, structured text, or any variation thereof. The keypad 48 may be located in the front face of the housing 22. The keypad 48 may be located proximal to the center of the front face of the housing 22. The keypad 48 may be located above the power button. The keypad 48 may be used by the user to program the microprocessor 44. A suitable embodiment for the keypad 48 may be a membrane keypad. Other embodiment of the keypad 48 may be a dome-switch keypad, a capacity keypad, or any variation thereof. The display 46 may be located in the front part of the housing 22. The display 46 may be located in the center of the front face of the housing 22. The display 46 may be located above the keypad 48. A suitable embodiment of the display 46 may be an organic light-emitting diode (OLED) display, nonetheless, other variety of displays may be used such as field sequential color LCD display, EBT LCD display, thin-film-transistor LCD display, or any variation thereof. The display 46 may be used to present information in visual form. The display 46 may show sections such as: the selection of the test, the programming interface, the catalogue of fuses, the results of the test. In conjunction the keypad 48 and the display 46 may be used for the user to interact with the present invention 10. The electrical port 43 may be located in the front side of the housing 22. The electrical port 43 may be located proximal to the bottom face of the housing 22. The electrical port 43 may be located next to the power button 41. The electrical port 43 may be located proximal to the right lateral face of the housing 22. A suitable embodiment of the electrical port 43 may be a high amperage power jack. In other embodiments the electrical port 43 may be a test probe connector, a banana plug, crocodile clip, screw terminals, or any variation thereof. The test cables 45 may be coupled to the electrical port 43. The test cables 45 may be test leads. The test cables 45 may have alligator clips, hook clips, slender probes, or any variation thereof. The test cables 45 may be connected to the circuit board assembly 60. For current testing the test cables 45 may be connected to the circuit board assembly 60 in series connection. Due to the high current rate that may flow through the electrical port 43 there may be an element that isolates the electrical port 43 and the microprocessor 44 in order to avoid damaging the microprocessor 44. In other embodiments the present invention may have an isolating component that may be connected between the microprocessor 44 and the electrical port 43. The isolating component may be a solid-state contactor which is an electrically controlled switch used for switching a power circuit that tolerates higher current ratings. In other embodiments the insolation component may be a relay, an optocoupler, or any variant of the aforesaid components.

The circuit board assembly 60 includes a circuit board 62. The circuit board 62 may be a power circuit, an electrical control panel, or any variation thereof. The electrical board 62 may be supplied with direct current or alternative current. The circuit board 62 may have electrical and electromechanical components. The test cables 45 may be connected where fuse may have blown in the circuit board 62. As shown in FIG. 1 the test cables 45 of the electrical assembly 40 are connected to the circuit board 62 for the simulation of a blown fuse.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A current testing device, comprising:
   a) a housing assembly, wherein said housing assembly includes a housing; and
   b) an electrical assembly, wherein said electrical assembly is mounted on said housing assembly, said electrical assembly includes a microprocessor, test cables, a battery, a power button and a display, said test cables are configured to be connected to an electrical circuit, wherein said microprocessor includes a memory, said memory stores a catalogue of fuses, said catalogue of fuses offers the possibility to select a fuse depending on a serial number or a specific brand said fuse presenting predetermined characteristics depending on said serial number or said specific brand, said microprocessor allows to simulate said fuse having said predetermined characteristics, said microprocessor is capable of determine a current level in said electrical circuit by means of said test cables, wherein said test cables are multimeter test leads, wherein said display indicates the current level of said electrical circuit, said microprocessor opens the electrical circuit if the current level exceeds specifications of said simulated fuse, wherein said battery is within said housing, said battery provides power to said microprocessor, wherein said power button is connected to said battery, said power button is configured to turn on and turn off said microprocessor by preventing battery to power said microprocessor.

2. The current testing device of claim 1, wherein said housing is made of a material that has electrical insulation and heat insulation characteristics.

3. The current testing device of claim 1, wherein said electrical assembly includes an electrical port, said test cables are connected in said electrical port.

4. The current testing device of claim 3, wherein said electrical port is a high amperage power jack.

5. The current testing device of claim 1, wherein said electrical assembly includes a keypad, said keypad is used for entering manually specify said predetermined characteristics of said fuse.

6. The current testing device of claim 5, wherein said keypad is used for selecting a fuse from a catalogue of fuses.

7. The current testing device of claim 1, wherein said display shows the result of the simulation conducted by said microprocessor.

8. A current testing device, consisting of:
   a) a housing assembly including a housing, said housing is made of a material that has electrical insulation and heat insulation characteristics; and
   b) an electrical assembly, wherein said electrical assembly includes a microprocessor, a keypad, a display, an electric port, test cables, a power button, and a battery, said battery supplies electric energy to said microprocessor, said microprocessor further includes a memory, said microprocessor allows to program a simulated fuse, said simulated fuse is chosen from a catalogue of fuses that is stored in said microprocessor's memory or simulated by entering manually a fuse's specifications, said keypad is used for entering said fuse's specifications or for selecting a fuse from said catalogue, said fuse's catalogue contains a variety of fuses from different brands and with different serial numbers, a distal end of said test cables are connected to said electric whereas opposite proximal ends of said test cables are configured to be connected to an electrical circuit of an electric board, where said microprocessor allows to simulate said fuse having predetermined characteristics, said microprocessor is capable of determine a current level in said electrical circuit by means of said test cables, wherein said test cables are multimeter test leads having two elongated cylindrical and pointed elements, wherein said display indicates the current level of said electrical circuit, said microprocessor opens said electrical circuit if the current level exceeds specifications of said simulated fuse, said power button is used to power on and off said current testing device.

\* \* \* \* \*